(12) United States Patent
Kawanishi et al.

(10) Patent No.: US 7,906,890 B2
(45) Date of Patent: Mar. 15, 2011

(54) PIEZOELECTRIC VIBRATING PIECES, FRAMES, AND DEVICES

(75) Inventors: Shingo Kawanishi, Saitama (JP); Masahiro Yoshimatsu, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 12/580,179

(22) Filed: Oct. 15, 2009

(65) Prior Publication Data

US 2010/0096954 A1 Apr. 22, 2010

(30) Foreign Application Priority Data

Oct. 16, 2008 (JP) ................... 2008-267807

(51) Int. Cl.
*H01L 41/08* (2006.01)
(52) U.S. Cl. .................................... 310/370
(58) Field of Classification Search ............. 310/370
See application file for complete search history.

(56) References Cited

U.S. PATENT DOCUMENTS

| | | | | |
|---|---|---|---|---|
| 6,898,832 B2 * | 5/2005 | Kawashima | .............. | 29/25.35 |
| 7,015,630 B2 * | 3/2006 | Tanaya | .............. | 310/370 |
| 7,342,352 B2 * | 3/2008 | Kawashima | .............. | 310/370 |
| 7,521,846 B2 * | 4/2009 | Tanaya | .............. | 310/370 |
| 7,675,224 B2 * | 3/2010 | Tanaya | .............. | 310/370 |
| 7,714,484 B2 * | 5/2010 | Hara et al. | .............. | 310/348 |
| 7,723,904 B2 * | 5/2010 | Kawashima | .............. | 310/370 |

FOREIGN PATENT DOCUMENTS

| | | |
|---|---|---|
| JP | 2005-341251 | 12/2005 |
| JP | 2006-033065 | 2/2006 |
| JP | 2007-060159 | 3/2007 |

\* cited by examiner

*Primary Examiner* — Mark Budd
(74) *Attorney, Agent, or Firm* — Klarquist Sparkman, LLP

(57) ABSTRACT

Piezoelectric vibrating pieces are disclosed that have a base and a pair of vibrating arms extending from one end of the base in a designated direction. A respective groove is defined in each of the upper and lower surfaces of each vibrating arm. The grooves extend in the designated direction and have a first width. Each groove includes a respective rib feature having a second width that is narrower than the first width. A piezoelectric frame includes the piezoelectric device and an outer frame surrounding the device. A piezoelectric device includes the piezoelectric vibrating piece or piezoelectric frame, a lid, and a base.

21 Claims, 11 Drawing Sheets

CI value and pulling sensitivity of width of rib portion (25%)

CI value and pulling sensitivity of width of rib portion (75%)

PIEZOELECTRIC VIBRATING PIECES, FRAMES, AND DEVICES

CROSS-REFERENCE TO RELATED APPLICATION

This application claims priority to and the benefit of Japan Patent Application No. 2008-267807, filed on Oct. 16, 2008, in the Japan Patent Office, the disclosure of which is incorporated herein by reference in its entirety.

FIELD

This disclosure relates to piezoelectric vibrating pieces, piezoelectric frames, and piezoelectric devices comprising the piezoelectric vibrating pieces and piezoelectric frames. More specifically, the disclosure pertains to piezoelectric vibrating pieces, frames, and devices that efficiently suppress unwanted increases of CI and have high rigidity as well as pulling sensitivity despite being miniaturized.

DESCRIPTION OF THE RELATED ART

For small information devices, such as HDDs (Hard Disc Drives), mobile computers, or IC cards, or clock sources for mobile phones, piezoelectric devices such as a piezoelectric vibrating piece or a piezoelectric oscillator are used. Especially nowadays, piezoelectric vibrating pieces and devices comprising same must be increasingly miniaturized and/or provided with a thinner or smaller profile to be accommodated in electronic devices and packaging schemes that are correspondingly miniaturized and/or provided with a thinner profile.

A "piezoelectric vibrating piece" typically comprises a base and at least a pair of vibrating arms extending in a longitudinal direction from the base. The base and arms are typically made as a single unit from a wafer of piezoelectric crystal material. A piezoelectric vibrating device is simply a piezoelectric vibrating piece contained in a package, such as a ceramic package. A "piezoelectric frame" is a piezoelectric vibrating piece surrounded in a plane by a frame used for forming the package around the piece. If the length of a vibrating arm is denoted L and the width of a vibrating arm is denoted W, then the vibration frequency F of the piezoelectric vibrating piece is proportional to $W/L^2$. Therefore, if the length L is reduced in an effort to achieve miniaturization, the vibration frequency increases, which is not usually preferred. Also, with reduced arm length and width, the rigidity of the piezoelectric vibrating piece may degrade and become unable to withstand a dropping impact.

Various techniques have been developed to prevent unwanted increases of the CI value and reductions of rigidity caused by miniaturization. Japan Unexamined Patent Application No. 2005-341251 discusses a piezoelectric vibrating piece that exhibits a reduced CI value while maintaining rigidity despite downsizing. The piezoelectric vibrating piece comprises a base, vibrating arms, grooves on the vibrating arms, and excitation electrodes formed on the grooves. The piece is formed of a piezoelectric material. The vibrating arms have progressively narrower profiles with increased distance from the base to the distal ends of the arms. In other words, the vibrating arms are more rigid near their base and less rigid near their distal ends. The width of the grooves progressively narrows closer to the base.

According to the JP '251 reference, the rigidity of the vibrating piece was improved by enhancing the rigidity of the base regions of the vibrating arms compared to the distal regions of the vibrating arms. Increased rigidity of the base regions of the vibrating arms does not induce lowering of the CI value of the second harmonic wave. In the piezoelectric vibrating piece discussed in this reference, multiple rib-shaped or wall-shaped stiffening features are provided at the grooves to enhance rigidity. In addition, trimmed regions are formed on the base to prevent oscillation leakage from the vibrating arms to the base and to suppress the CI value.

Japan Unexamined Patent Application No. 2006-033065 discusses a piezoelectric vibrating piece in which it is possible to suppress increases of the CI value while achieving miniaturization. The vibrating piece comprises a base, vibrating arms, grooves formed on both the upper and lower surfaces of the vibrating arms, and excitation electrodes formed on and in grooves. The vibrating piece is formed of a piezoelectric material. On one of the upper and lower surfaces of the vibrating arms, the respective grooves are extended toward the distal ends of the vibrating arms. On the other surface the grooves are not extended, but include a metal film for controlling vibration frequency. The metal film is formed near the distal ends of the vibrating arms, wherein the grooves on the other surface do not extend that far. As a result of the extended length of the grooves on one surface, the efficiency of the electrical field produced in the arms is increased so that CI value of the vibrating piece can be reduced.

In a miniaturized piezoelectric vibrating piece the distance between excitation electrodes formed on the grooves is very small. The small distance between the electrodes increases the capacitance of series resonance and increases the "pulling sensitivity" of the arms. Increasing the pulling sensitivity increases the sensitivity of frequency variability, which makes it difficult to adjust the vibration frequency of 32.768 kHz, which is the objective frequency.

With a piezoelectric vibrating piece as disclosed in Japan Unexamined Patent Application No. 2007-060159, the pulling sensitivity is reduced by forming insulating layers on the extraction electrode. Additional capacitance additional electrodes are formed on the insulating layers.

SUMMARY

The grooves formed on the vibrating arms of a piezoelectric vibrating piece according to the '251 reference present certain limitations for use in miniaturized configurations of a piezoelectric vibrating piece. Increased miniaturization results in reductions of the areas of the grooves and in areas in which excitation electrodes can be formed. Consequently, the CI value is undesirably increased. To maintain the rigidity of the piece, stiffening features are added to the arms and trimmed regions are provided on the base to preventing oscillation leakage. However, fabrication steps for forming such a configuration become excessively difficult as the piezoelectric vibrating piece is further miniaturized. Miniaturization also causes the pulling sensitivity S to increase undesirably as a result of the distance between excitation electrodes being reduced, and increases the amount of change to the load capacitance, which increases the difficulty of adjusting the intended vibration frequency.

With the piezoelectric vibrating piece discussed in the '065 reference, the CI value produced in areas of extended grooves can be lowered. However, as the grooves are extended toward the distal ends of the vibrating arms, arm rigidity is reduced in the extended-groove regions. Also, as the vibrating piece is downsized, the distance between the excitation electrodes is reduced, which increases the motional capacitance and increases the pulling sensitivity S. To reduce the pulling sensitivity S, the motional capacitance needs to be small. But, as the capacitance is reduced, the CI value increases.

In the manufacturing method discussed in the '149 reference, many and complicated steps need to be performed, such as forming extraction electrodes on insulating layers and forming additional capacitance electrodes. The tuning-fork type piezoelectric vibrating piece configured to oscillate a 32.768 kHz must be manufactured within a tolerance range of ±20 ppm to ±30 ppm. Whenever a tuning-fork type piezoelectric vibrating piece having a tolerance range of ±20 ppm to ±30 ppm is used in commercial or industrial electronic devices, the vibrating piece is adjusted accurately to oscillate at 32.768 kHz using a variable condenser. For this adjustment, the capacitance of the condenser must be 1 picofarad and the pulling sensitivity S must not be greater than about 20 ppm; otherwise the frequency adjustment is very difficult to perform.

Therefore, a purpose of the present invention is to provide piezoelectric vibrating pieces, piezoelectric frames, and piezoelectric devices containing same that provide an effective way to lower the CI value and the pulling sensitivity S to, for example, equal or less than 20 ppm, and especially to balance the pulling sensitivity S and CI value, while providing increased rigidity.

The shortcomings of conventional art summarized above are addressed by piezoelectric vibrating pieces and devices as disclosed herein. A first aspect of the invention is directed to piezoelectric vibrating pieces, of which a representative embodiment comprises a base, a pair of vibrating arms extending in the Y-axis direction from one end of the base, and a groove formed on each of the upper and lower surfaces of each vibrating arm. Thus, each vibrating arm has two grooves, one on the upper surface, the other on the lower surface. The grooves extend in the Y-axis direction with a first width. Each groove comprises a respective rib feature that extends, from at least one longitudinal wall of the groove, in the X-axis direction (normal to the Y-axis direction). The rib feature(s) of each groove define an opening having a second width that is narrower than the first width. The rib feature(s) in the groove increases the rigidity of the respective vibrating arms, reduces motional capacitance, and reduces the pulling sensitivity S.

Each groove and respective rib feature includes a respective excitation electrode to excite the respective vibrating arm. Due to crystal etching anisotropy, the rib feature includes an inclined (or "tapered") surface extending to the surface of the groove. As a result of the excitation electrode being situated over the surface of the respective groove and respective rib feature, unwanted fracture of the conductive property of the electrode is prevented.

Each groove has two longitudinal sides or "walls," namely a +X side (or wall) and a –X side (or wall). The rib feature can extend from only one longitudinal wall or from both longitudinal walls. In an example of the former, the rib feature extends from the +X wall toward the –X wall. With such a configuration, and by way of example, the pulling sensitivity S of the piezoelectric vibrating piece is reduced to 15 ppm/pF. By forming a rib feature only on the +X side, for example, the etching mark(s) resulting from crystal etching anisotropy are changed. The resulting changes in groove shape provide the vibrating arms with high rigidity and high resistance to physical impact.

In other embodiments, the rib feature of each groove extends from both walls of the groove.

In certain embodiments the rib feature is situated at mid-length (in the Y-direction) in the respective groove or in the range from the mid-length to the proximal end (nearest the base) of the groove. If the rib feature were situated beyond mid-length in the groove (in the range from mid-length to the distal end of the groove), the CI value of the vibrating arm would be reduced, but the pulling sensitivity S would undesirably increase. By providing the rib closer to the base, electric charges tend to gather at the root portion of the vibrating arm, which markedly affects the behavior of the piezoelectric vibrating piece, particularly by reducing the pulling sensitivity S. By providing the rib feature "below" the center line of the groove in the Y-axis direction, the CI value and pulling sensitivity are well balanced.

The width of the rib feature desirably is in a range of no less than 40% to no more than 95% of the width of the groove. An even more desirable range is no less than 80% to no more than 95%. As the width of the rib feature is increased, the rigidity of the vibrating arms is increased and the pulling sensitivity thereof is reduced.

A desired thickness of the rib feature is a range of no less than 70% to no more than 95% of the thickness of the groove. By maintaining rib thickness within this range, improved pulling sensitivity S, CI value, and rigidity are achieved.

The vibrating arms in some embodiments comprise respective hammer-head portions that are wider (in the X-axis direction) than the width of an individual vibrating arm. The hammer-head portions are situated on the distal tips of the respective vibrating arms. A groove formed on at least one of the upper and lower surfaces of a respective vibrating arm can extend to the hammer-head portion. By extending grooves in this manner, available area for forming excitation electrodes is increased. Thus, the CI value is reduced and the efficiency of the electrical field produced by the electrodes is increased. Aside from the rib features, the grooves can be formed on the vibrating arms in the same manner and configuration as conventional grooves on conventional vibrating arms, which allows frequency adjustment to be performed in a conventional manner.

Another embodiment of a piezoelectric device comprises a pair of vibrating arms extending in the Y-axis direction from one end of a base. A respective groove is defined on each of the upper and lower surfaces of each vibrating arm. Each groove has a first width and includes an excitation electrode extending from the base to the groove (and in the groove) to excite the vibrating arms. Each vibrating arm is flanked by a respective supporting arm that extends, in the Y-axis direction, outboard of the vibrating arm from one end of the base. Each supporting arm terminates with a respective connecting arm that extends from the respective supporting arm in the X-axis direction. The device also includes a frame portion that surrounds the base, vibrating arms, and supporting arms. The connecting arms are connected to the frame portion. Each groove includes a rib feature that extends, in the X-axis direction (which is normal to the Y-axis direction) from one groove wall to the opposing groove wall to form an opening portion having a second width. The second width is narrower than the first width of the groove, which reduces the pulling sensitivity S of the piece.

According to another aspect of the invention, piezoelectric devices are provided. A representative embodiment comprises a piezoelectric vibrating piece according to any of the various embodiments summarized above, for example, contained in a package. An embodiment of the package includes a lid covering the piezoelectric vibrating piece and a package base supporting the piezoelectric vibrating piece. I.e., the piezoelectric vibrating piece is sandwiched between the package base and the lid. By configuring the piezoelectric vibrating device (with piezoelectric vibrating piece as summarized above) in this manner, piezoelectric device exhibiting excellent pulling sensitivity S, CI values, and rigidity are produced.

Another embodiment of a piezoelectric device comprises a piezoelectric frame as summarized above, a lid covering the piezoelectric frame, and a base supporting the piezoelectric frame.

According to the present invention, piezoelectric vibrating pieces, piezoelectric frames, and piezoelectric devices are provided that limit increases of CI value, exhibit excellent pulling sensitivity S, and have increased rigidity, even when miniaturized.

DETAILED DESCRIPTION

Figure 1:
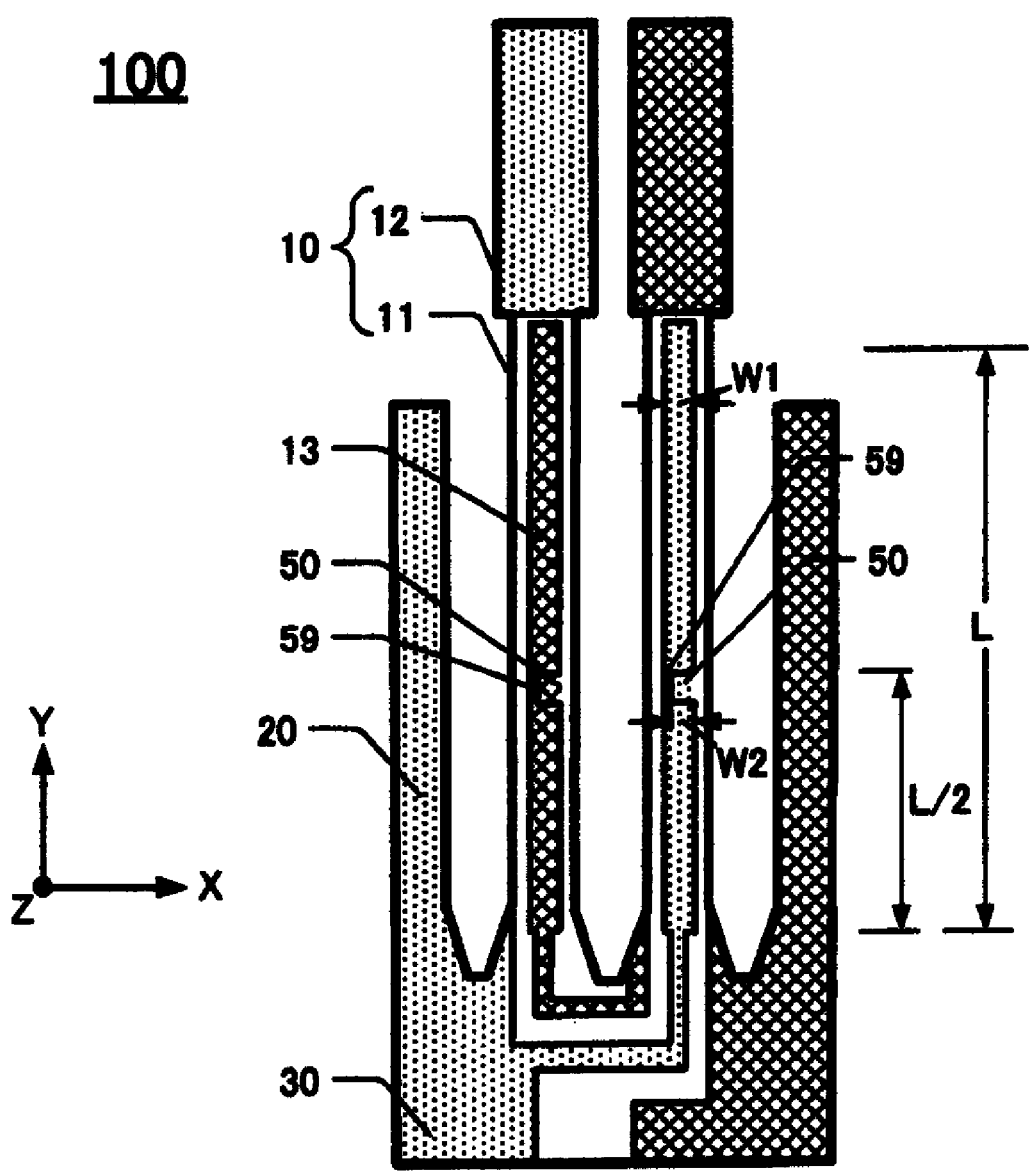
FIG. 1 is a plan view of a first embodiment of a tuning-fork type piezoelectric vibrating piece.

The best mode of the present invention will be described below by referring the drawings, but it will be understood that the scope of the invention is not limited to what is specifically depicted in the drawings.

First Embodiment of Tuning-Fork Type Piezoelectric Vibrating Piece

FIG. 1 is a plan view of this embodiment 100 of a tuning-fork type piezoelectric vibrating piece. This embodiment comprises a pair of vibrating arms 10 extending in the Y-axis direction (which is a designated longitudinal direction), a base 30 made of a piezoelectric material and formed continuously with the vibrating arms 10. In this embodiment the length of each vibrating arm 10 is about 1.25 mm and the length of the base is about 0.15 mm. The width (in the X-axis direction) of each vibrating arm 10 is 55 µm. This embodiment also comprises a pair of supporting arms 20 extending in the Y-axis direction. The supporting arms 20 are situated outboard of the respective vibrating arms.

The vibrating arms 10 extend in the Y-axis direction from the base 30. On each vibrating arm 10 a respective groove 13 is formed on the upper surface (visible in drawing) and a respective groove 14 (not visible in drawing) is formed on the lower surface, yielding a total of four grooves per pair of vibrating arms 10. The width W1 in the X-axis direction of each groove 13, 14 is 30 µm, and the length of each groove is 0.8 mm.

Between the vibrating arms 10 is a "root portion" that, in this embodiment, has angled sides similar to a "V"). Thus, the root portion widens in the X-axis direction with distance from the base. Because of this profile, oscillations of the vibrating arms 10 concentrate stress around the root portion to prevent oscillation leakage to the base 30. Each vibrating arm 10 extending from the base 30 comprises an arm portion 11 and a hammer-head portion 12, the latter being wider than the arm portion 11. The grooves 13, 14 are formed on the arm portions 11 of the arms.

The hammer-head portions 12, being formed wide at the distal end of each arm portion 11, moderate vibrations of the vibrating arms 10 and enable the vibration frequency to be lowered. The hammer-head portions 12 have identical designated respective widths in the Y-axis direction. This configuration, compared to conventional art, enables reductions in vibration frequency and allow moderation of vibration of vibrating arms 10 having shorter length. By controlling the width and the length of the hammer-head portion 12 as well as the length of the arm portions 11, increases of CI value can be limited.

Excitation electrodes and base electrodes (hatched regions in FIG. 2) are formed on the principal and edge surfaces of the vibrating arms 10, the grooves 13, 14, the supporting arms 20, and the base 30. These electrodes are formed by, for example, sputtering deposition. Each electrode is a double layers; a gold (Au) layer of 400 to 2000 Angstroms thickness is layered on a chrome (Cr) layer of 150 to 700 Angstroms thickness. Instead of chrome (Cr), titanium (Ti) can be used; instead of gold (Au), silver (Ag) can be used. Alternatively, instead of a double layer, each of these electrodes can be formed as a single layer of an alloy of copper (as main component) and aluminum which can produce high adhesion, corrosion resistance, electrical conductivity, and heat resistance.

As shown in FIG. 1, a respective rib feature 50 is formed on each groove 13. The rib feature 50 extends substantially only in the −X-direction of the groove 13 so that the width of the groove 13 at the location of the rib feature 50 is correspondingly narrowed. Substantially identical rib features 50 are formed on the respective grooves of each vibrating arm. Since the respective rib features 50 formed on the grooves 13, 14 are similar, the rib feature 50 formed on a groove 13 will be used for further explanation below.

Figure 2:
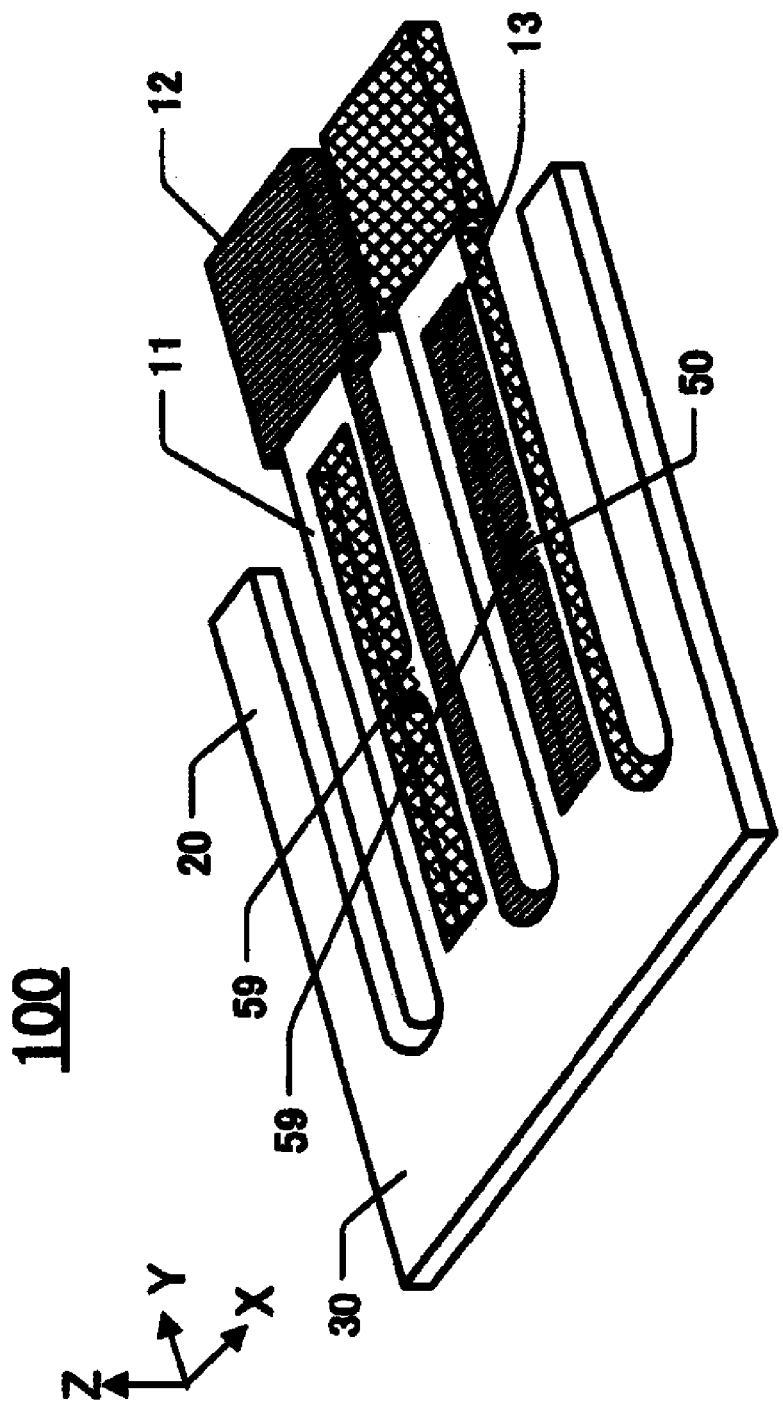
FIG. 2 is a simplified perspective view of the first embodiment of a tuning-fork type piezoelectric vibrating piece.

FIG. 2 is a perspective view of the first embodiment of a piezoelectric vibrating piece 100, with the base electrodes not shown. As shown in FIG. 2, a respective excitation electrode is formed on the entire surface of the grooves 13 as well as on the rib features 50. Note that the rib feature 50 extends from only one wall of the groove 13. Thus, the groove 13 narrows at the rib feature 50. In other words, the rib feature 50 forms an opening 59 that is narrower (in the X-axis direction) than the groove 13.

Figure 3A:
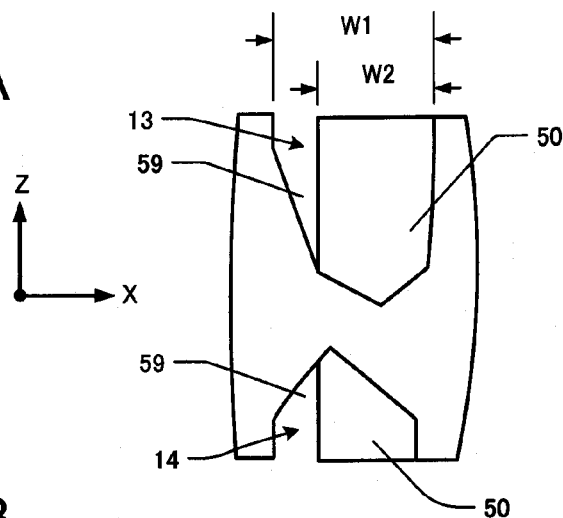
FIG. 3A is a cross-sectional view of an actual groove in a vibrating arm of the first embodiment of a tuning-fork type piezoelectric vibrating piece.
Figure 3B:
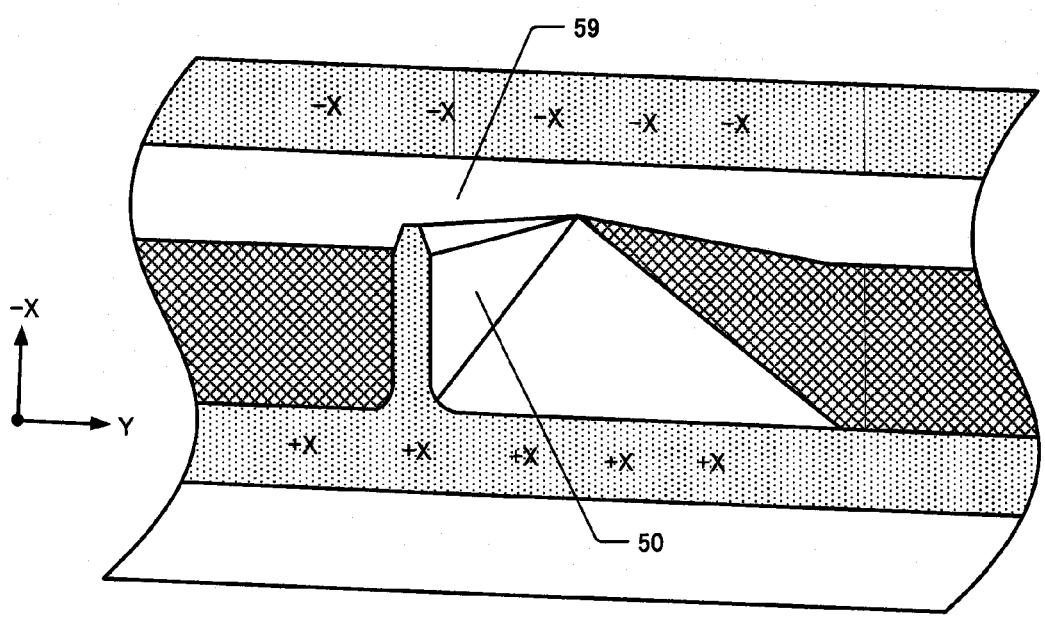
FIG. 3B is an enlarged view of a rib feature formed on the groove of the first embodiment.

FIG. 3A is an enlarged cross-sectional view of actual grooves 13, 14 of this embodiment 100. FIG. 3B is a further enlargement of a rib feature 50 as formed on a groove 13, 14. In FIG. 3A the excitation electrode is not shown. In FIG. 3B, for better understanding, the bottom of the groove and the upper surface of the vibrating arm are hatched.

As shown in FIGS. 3A and 3B, the grooves 13, 14 as actually formed include an etching mark because of the natural anisotropy of crystal etching. An etching mark is also formed on the rib feature 50, which is formed simultaneously with forming the outline profile of the piezoelectric vibrating piece 100. As a result of the rib feature 50 providing the opening 59, the rib feature can prevent failures such as breakage of an excitation electrode, compared to a configuration in which the groove includes a rib but without the opening.

As shown in FIG. 3B, the rib feature 50 extends from only one wall of the groove, which is in the −X direction. In FIG. 3A, the width W2 of the rib feature portion 50 is 80% of the width W1 of the groove 13. By way of example, in this embodiment the width W1 is 30 μm and the width W2 is 24 μm. Thus, the width of the opening 59 is 6 μm. The thickness of the rib feature 50 is almost the same as of the groove 13, which allows the rigidity of the vibrating arm 10 to be maintained despite the presence of the rib feature. Increased stresses caused by the relatively heavy hammer-head portion 12 (which otherwise could degrade the rigidity of a vibrating arm) are also supported by the rib feature 50 formed on the groove portion 13. Thus, again, the rigidity of the vibrating arms is maintained. In addition, the motional capacitance C1 is reduced by the presence of the rib feature 50, and the pulling sensitivity S is lowered. For example, in this embodiment, the pulling sensitivity S of the tuning-fork type piezoelectric vibrating piece is about 15 ppm/pF, which is very low.

The rib feature 50 in this embodiment is formed at midlength of the groove 13, which is 50% of the length L toward the base 30. In other words, the rib feature 50 is formed at the center of the length L or at a location less than 50% of the length L. This configuration improves rigidity of the base of the piezoelectric vibrating piece 100. Positioning the rib feature 50 closer (than 50% of L) to the base 30 reduces oscillation of the vibrating arms, which tends to increase the CI value. If the rib feature 50 were formed more distally than 50% of L in the Y-axis direction of the groove 13, then the rib feature 50 would be located farther from the base 30, which would increase the pulling sensitivity S. Therefore, it is preferable that the rib feature 50 be located not farther than 50% of L in the Y-axis direction, and thus not any farther from the base 30.

The width W2 of the rib feature 50 is not limited unless the groove 13 is not completely divided by the rib feature 50. However, to keep the CI value sufficiently small and to maintain a compatible pulling sensitivity S, it is preferable that the width W2 be no less than 40% and no greater than 95% of W1, more preferably no less than 60% and no greater than 95% of W1, and most preferably no less than 80% and no greater than 95% of W1. It is not desired that the width W2 be 100% of the width W1 because the CI value is too high under such a condition.

The pulling sensitivity S of an example of this embodiment 100 was measured. The vibrating arms 10 were 55 μm wide and 1.24 mm long. The grooves 13, 14 were 30 μm wide and 0.8 mm long. The rib feature 50 in each respective groove 13, 14 had a width of 80% of W. The rib features 50 in the respective grooves 13 extended in the +X-direction. The measured pulling sensitivity S was 15 ppm/pF.

Second Embodiment of Tuning-Fork Type Piezoelectric Vibrating Piece

Figure 4:
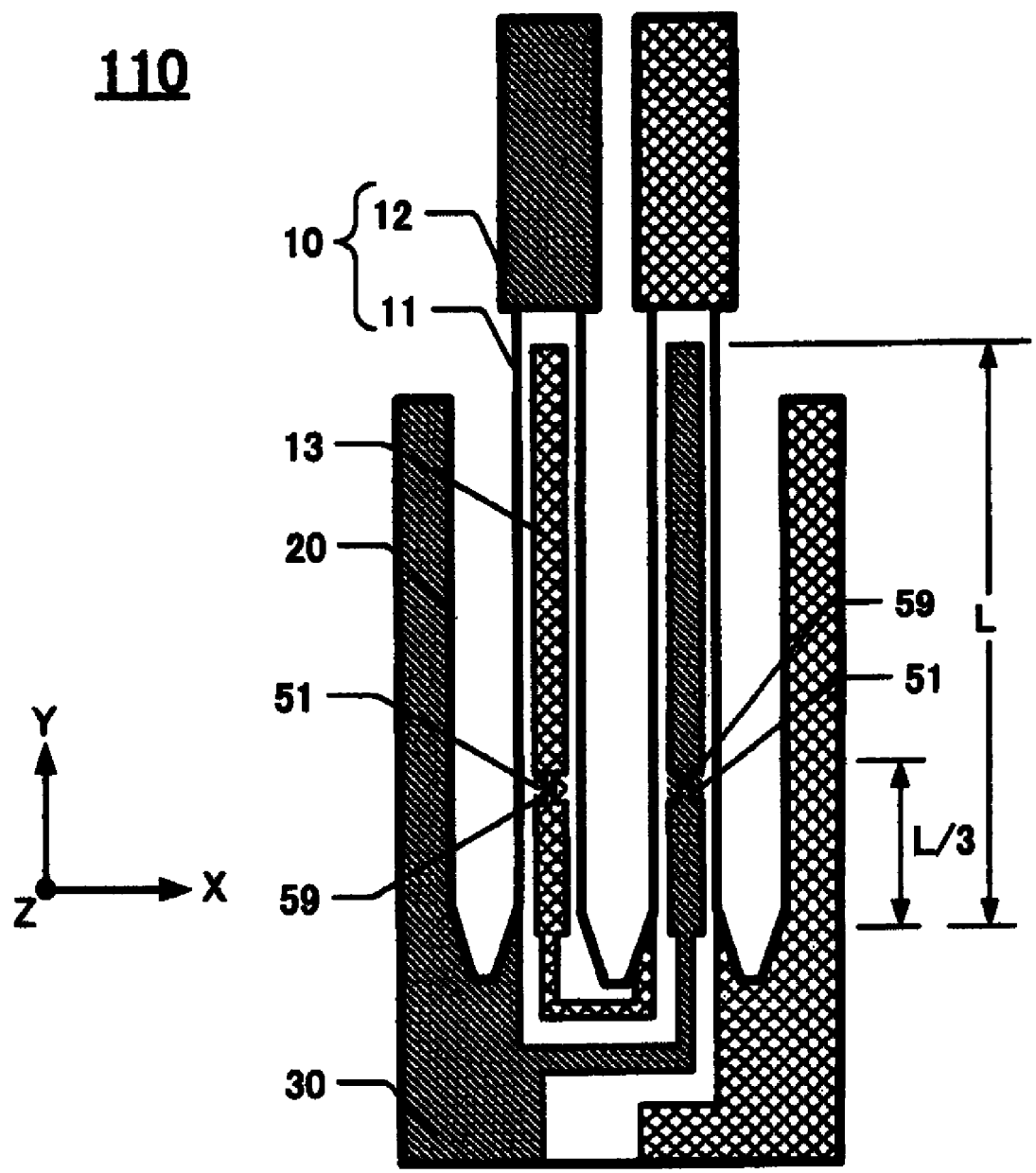
FIG. 4 is a plan view of a second embodiment of a tuning-fork type piezoelectric vibrating piece.

The piezoelectric tuning-fork type vibrating piece 110 according to this embodiment is shown in FIG. 4. The piece 110 has substantially the same configuration as of the first embodiment 100 except for the configuration of the rib feature 51. The rib feature 51 is described below, but other detail being the same as in the first embodiment are not described further.

A respective rib feature 51 is situated in each groove 13, 14. In each groove, the rib features 51 extend from each of the +X and −X walls of the groove, and the respective rib features 51 extend toward each other in the groove. That is, the rib features 51 in the groove form an opening 59 that is narrower than the respective groove 13.

As FIG. 4 shows, the length of a groove 13, 14 is denoted L. In this embodiment the rib feature 51 is situated at a distance 3/L from the base toward the distal end of the groove. That is, the position of the rib feature 51 is at 33% of the length of the respective groove 13, 14.

Figure 5A:
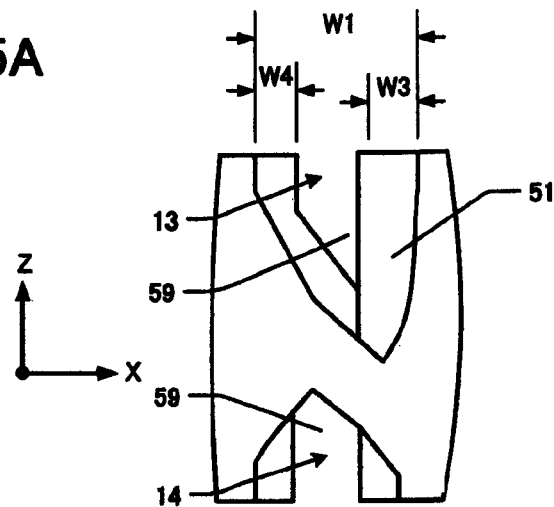
FIG. 5A is a cross-sectional view of an actual groove in a vibrating arm of the second embodiment of a tuning-fork type piezoelectric vibrating piece.
Figure 5B:
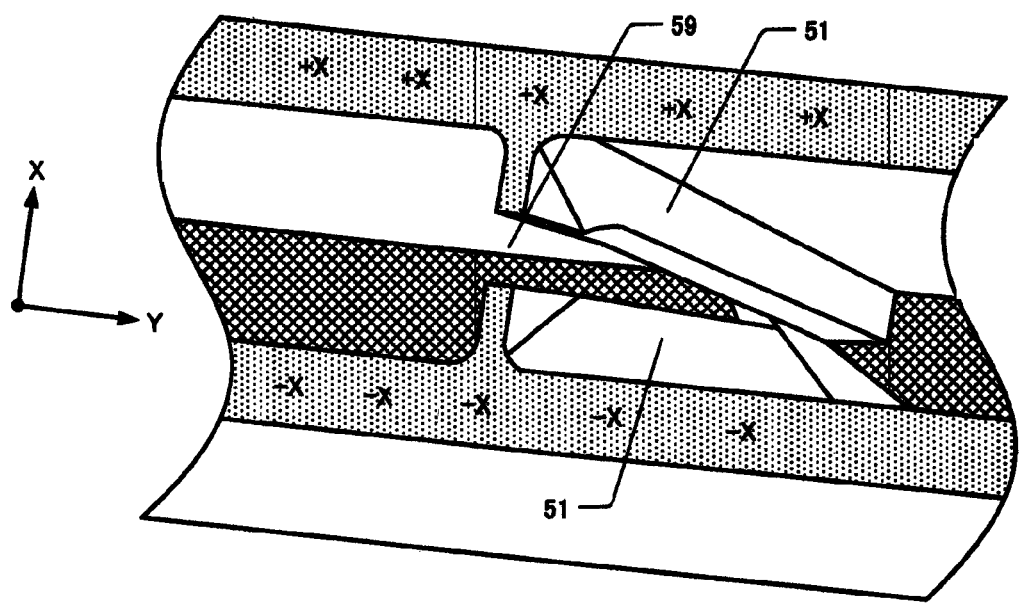
FIG. 5B is an enlarged view of a rib feature formed on the groove of the second embodiment.

Reference is now made to FIG. 5A which shows enlarged detail of a cross-sectional view of an actual groove 13, 14 of this embodiment. FIG. 5B is a perspective view of the enlargement of the rib feature 51 as formed on an actual groove 13, 14. In FIG. 5B, each groove includes two rib portions that form the respective rib feature 51. One rib portion has width W3, and the other rib portion has width W4. These rib portions extend toward each other and form the rib feature 51. In FIG. 5A, the excitation electrode is not shown. In FIG. 5B, for better understanding, the bottom of the groove and the top surface of the respective vibrating arm are shown hatched.

In this embodiment 110 the widths W3, W4 of the respective portions of the rib feature 51 can be the same or different. The widths are not limited so long as the total width W3+W4 is not less than 40% of the width of the respective groove. In this embodiment as depicted, the widths W3 and W4 are slightly different, and the rib portion extending from the +X side to the −X side of the groove is slightly wider than the other rib portion. Also, the sum W3+W4 is about 60% of the width W1 of the groove 13. Such a configuration makes full use of characteristics caused by crystal etching anisotropy. The two portions of the rib feature 51 have about the same thickness in each of the grooves 13, 14.

In this embodiment, the two portions of the rib feature 51 face each other. But, this embodiment is not limited to this specific configuration. The two portions of a rib feature 51 in one groove 13, for example, can be shifted relative to each other in the Y-axis direction. But, in this case, the two rib portions have respective widths that are no greater than 50% of the length L of the groove 13.

To maintain balanced oscillation of the pair of vibrating arms 10, it is preferable that the width ratio of the rib portion on the −X wall and to the rib portion on the +X wall of a groove 13 of a vibrating arm 10 be 3:5, by way of example, and that this ratio be the same in the other vibrating arm example. By displacing the two rib portions in the Y-axis direction in a groove, the width of the rib portions can be greater. Thus, the rigidity of the piezoelectric vibrating piece is increased while lowering the pulling sensitivity S.

Figure 6:
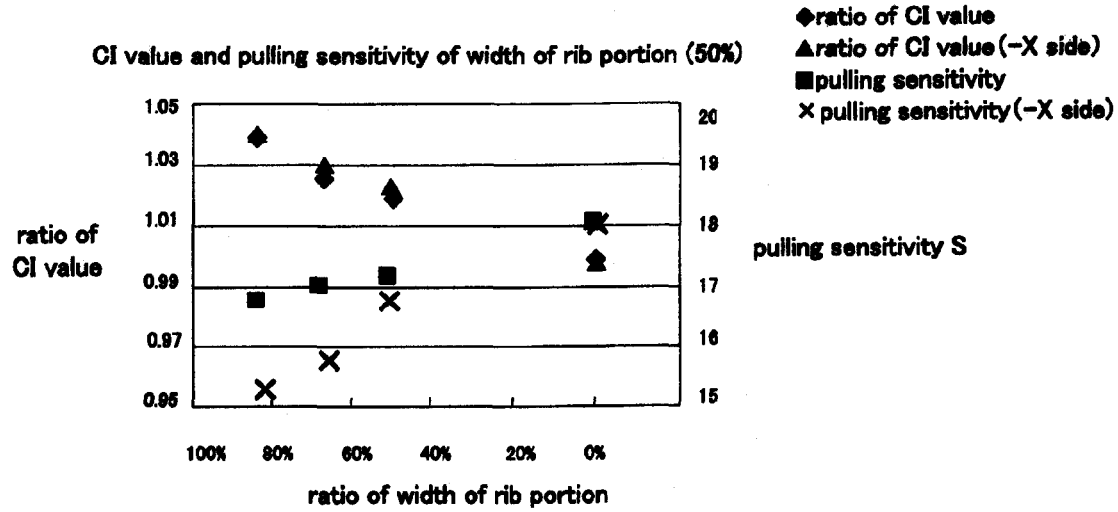
FIG. 6 is a graph of CI value and pulling sensitivity S as functions of the width of the rib feature whenever the rib feature extends 50% of the length of the groove.

FIG. 6 is a graph of CI value and pulling sensitivity S relative to the width of the rib feature 50 whenever the rib feature 50 is situated at 50% of the length of the groove. The horizontal axis is the ratio of the width of the rib feature 50 to the width of the groove 13; as this percentage is reduced, the rib feature 50 becomes narrower. A width ratio of 0% means that the groove does not have a rib feature. One vertical axis is the ratio of CI value, which is the CI value with rib to the CI value without rib. The other vertical axis is pulling sensitivity S. As the ratio increases, the pulling sensitivity S decreases. Although the pertinent data is not shown, the data for the rib feature 51 was substantially the same as the depicted data for the rib feature 50.

In FIG. 6 the ratio of CI value (at the −X side) and the pulling sensitivity S (at the −X side) are the mean CI value and pulling sensitivity S of a configuration in which rib features are only on the −X wall a groove (i.e., the opening 59 is on the −X side of the groove), such as in the first embodiment 100 of a tuning-fork type piezoelectric vibrating piece. In the second embodiment 110, the ratio of CI value and the pulling sensitivity S are the mean CI value and pulling sensitivity S of a configuration in which respective rib features are on both walls (−X and +X sides) of a groove of the embodiment. As shown in FIG. 6, as the ratio of width of a rib feature to the width of a groove 13 increases, the pulling sensitivity S is correspondingly decreased. But, as the ratio of CI values increases, the CI value correspondingly increases.

Referring further to FIG. 6, although there is little difference between the CI value and the CI value at the opening on the −X side of the groove, there is a great difference between the pulling sensitivity and the pulling sensitivity at the −X side opening. With increases in the width of a rib feature 50 formed on the +X side, due to crystal etching anisotropy the opening 50 becomes shallower and the areas in which electrodes are formed are reduced. Motional capacitance C1 is a parameter that depends on the areas of the electrodes. Pulling sensitivity S is expressed by Equation (1), below. As the motional capacitance C1 is reduced, the pulling sensitivity S also decreases. The CI value changes little with changes in electrode areas and shapes in this case. Thus, changes in CI value when the rib feature is formed on the +X side of the groove are not great.

$$S = -C_1/2(C_L + C_0)^2 \quad (1)$$

In this case, in equivalent circuits including the piezoelectric vibrator, $C_1$ denotes motional capacitance, $C_L$ denotes load capacitance, and $C_0$ denotes shunt capacitance.

Figure 7A:
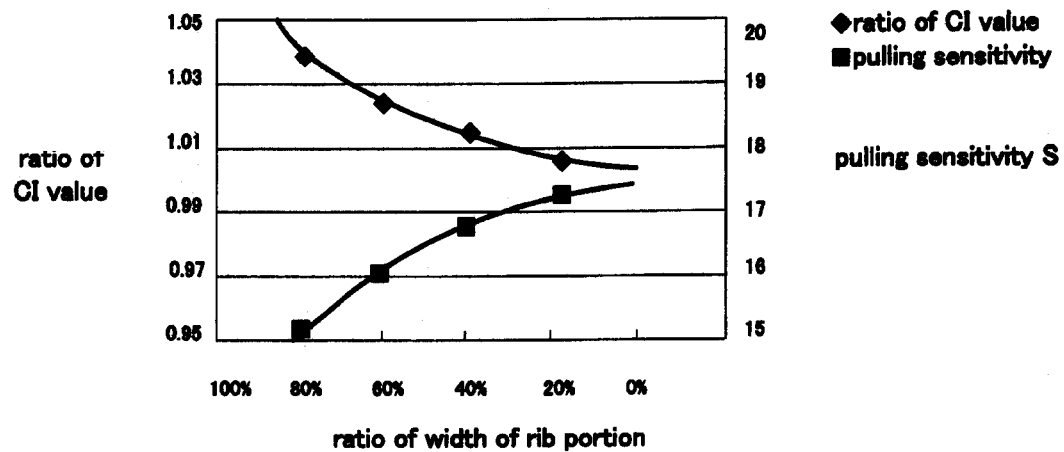
FIG. 7A is a graph of CI value and pulling sensitivity S as functions of the width of the rib feature whenever the rib feature extends 25% of the length of the groove.
Figure 7B:
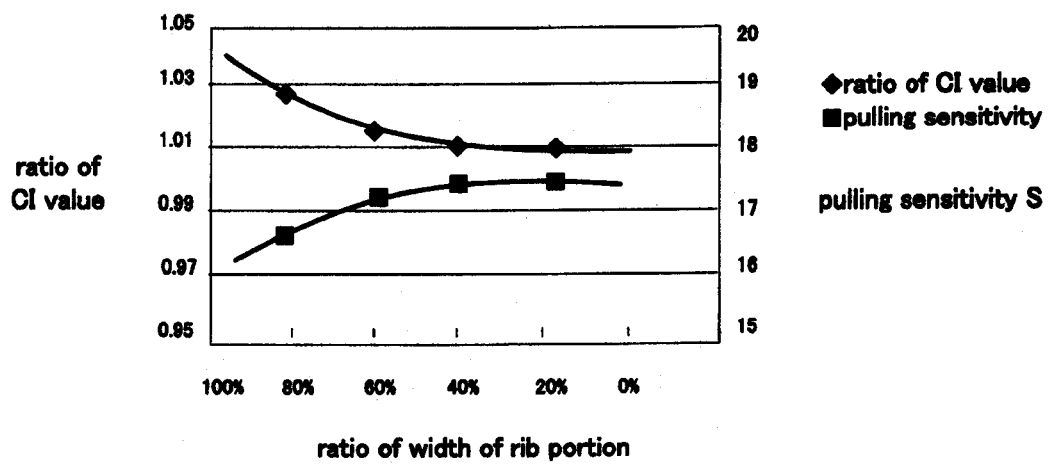
FIG. 7B is a graph of CI value and pulling sensitivity S as functions of the width of the rib feature whenever the rib feature extends 75% of the length of the groove.

FIG. 7A depicts the impact, on CI value and pulling sensitivity S, of the width of a rib feature 50 whenever the rib feature 50 is situated in the groove at 25% from the base of the length of the respective groove. Similarly, FIG. 7B depicts the impact, on CI value and pulling sensitivity S, of the width of a rib feature 50 whenever the rib feature 50 is situated at 75% of the length of the respective groove. FIG. 7A depicts that the trend of increased CI with corresponding increases in the width of the rib feature 50 is greater whenever the rib feature is situated in the groove at a position that is 50% of the groove length compared to a position that is 25% of the groove length. FIG. 7A also depicts that the trend of decreased S with corresponding increases in the width of the rib feature 50 is greater whenever the rib feature is situated in the groove at a position that is 50% of the groove length compared to a position that is 25% of the groove length. However, the trend of increased CI with corresponding increases in rib width and the trend of decreased S with corresponding increases in rib width is less whenever the rib feature 50 is situated in the groove at a position that is 75% of the groove length. It is believed that these effects are caused by accumulations of electrical charges at the root portions.

Third Embodiment of Tuning-Fork Type Piezoelectric Vibrating Piece

Figure 8:
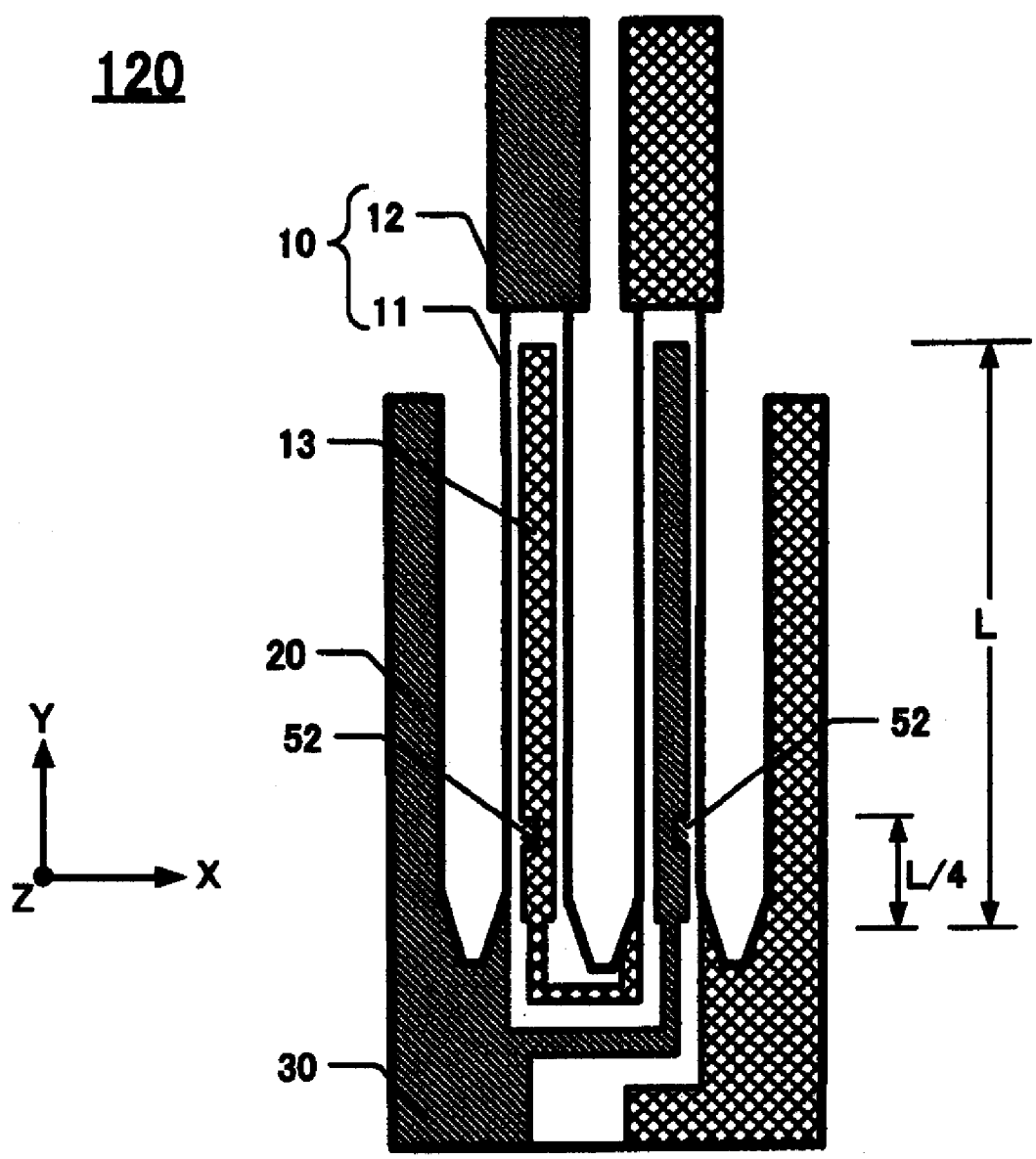
FIG. 8 is a plan view of a third embodiment of a tuning-fork type piezoelectric vibrating piece.

FIG. 8 is a plan view of a third embodiment 120 of a tuning-fork type piezoelectric vibrating piece. The piece 120 has substantially the same configuration as the first embodiment 100, except for the rib feature 52. Thus, the rib feature 52 is described below in detail while omitting supererogatory descriptions of the other features.

FIG. 8 shows that, in this embodiment 120, a respective rib feature 52 is situated in each groove 13, 14 (grooves 14 not shown because they are on the under-surface of the vibrating arms). Thus, each groove on the upper surface and each groove on the lower surface has a respective rib feature. As depicted in the figure, the rib feature 52 in one of the grooves 13 extends from the +X wall of the groove, and the rib feature in the other of the grooves 13 extends from the −X wall of the groove. The ribs 52 are configured similarly in the grooves 14 on the under surface.

The width of each rib feature 52 of this embodiment is 40% of the width of the respective groove 13, 14. Each rib feature 52 is situated in the respective groove 13, 14 at 25% of length L of the groove. Although not shown in the figure, the thickness of each rib feature 52 is 80% of the thickness of the respective groove 13, 14. These dimensional characteristics can be readily achieved by increasing the amount of etching performed when forming the grooves 13, 14 and rib features 52.

Fourth Embodiment of Tuning-Fork Type Piezoelectric Vibrating Piece

Figure 9:
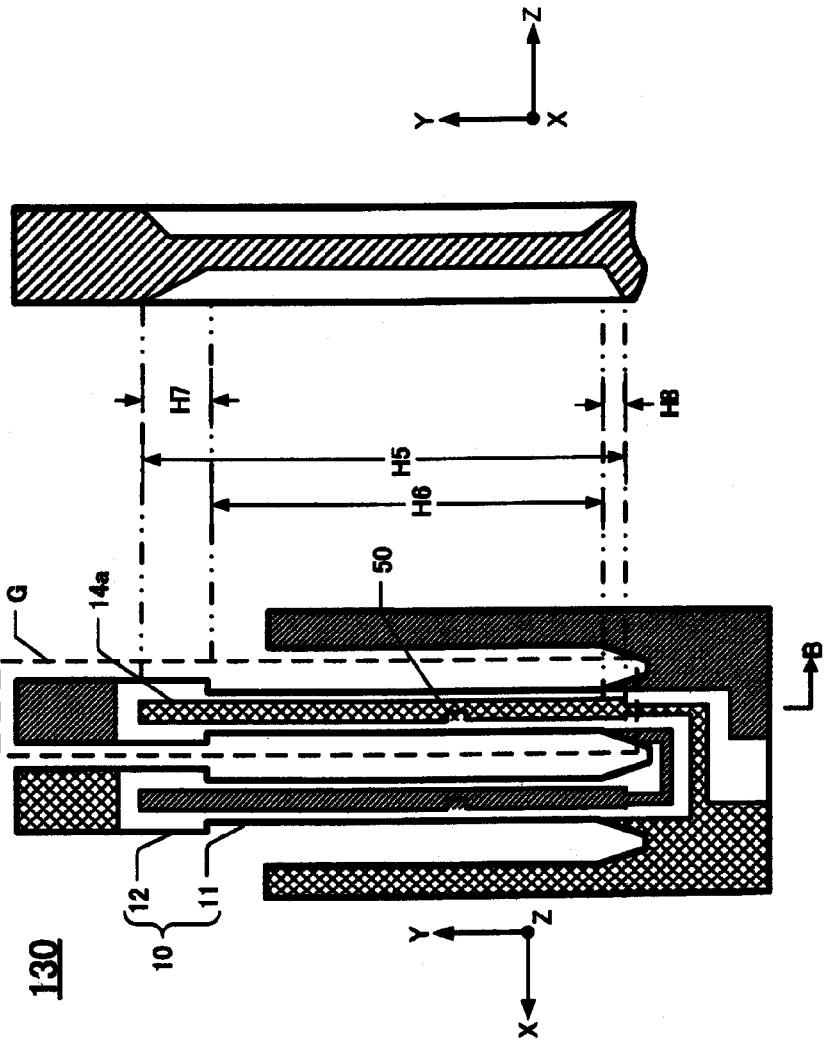
FIG. 9A is a plan view of the "upper" surface of a fourth embodiment of a tuning-fork type piezoelectric vibrating piece.
FIG. 9B is a plan view of the "lower" surface of the fourth embodiment.
FIG. 9C is an enlarged cross-sectional view of the region denoted "G" in FIG. 9B, along the line B-B in FIG. 9B.

FIG. 9A is a plan view of the "upper" surface of this embodiment of a tuning-fork type piezoelectric vibrating piece 130. FIG. 9B is a plan view of the "under" surface. FIG. 9C is an enlarged cross-sectional view along the line B-B in FIG. 9B. This embodiment 130 comprises a pair of vibrating arms 10 each including a respective arm portion 11 and a respective "hammer-head" portion 12. The vibrating arms 10 extend from a base 30. This embodiment also includes a pair of supporting arms 20 that are similar to the supporting arms of the first embodiment 100. Also, each arm portion 11 includes a respective groove 13 on the upper surface. On the under surface, each arm portion 11 includes a longitudinally "extended" groove 14a extending to the respective hammer-head portion 12. In the grooves 13, 14a, respective rib features 50 are situated as in the first embodiment.

The extended groove 14a extends partially over the respective hammer-head portion 12. The groove 14a can be formed simultaneously with forming the outline profile of the piezoelectric vibrating piece 130. Note also that, in the grooves 14a, the respective electrodes extend to almost half the length of the respective hammer-head portions 12. Compare to the first embodiment 100 in which the electrodes do not extend into the hammer-head portions.

Referring further to FIGS. 9A, 9B, and 9C, the grooves 13 and extended grooves 14a are now described. Referring to FIG. 9A, the length of the groove 13 on the upper surface of each vibrating arm is denoted H1. As a result of crystal etching anisotropy, residual etching marks remain at both ends of each groove 13 in the Y-axis direction (FIG. 9C). The etching mark on the distal end of the groove 13 has a length denoted H3, and the etching mark on the proximal end (nearest the base 30) of the groove 13 has a length denoted H4.

Hence, the effective length of the groove 13 contributing to arm oscillation is its length less the lengths H3, H4 of these etching marks. This is shown in FIG. 9B, in which the length of the groove 13 effectively contributing to arm oscillation is denoted H2. The length H2 is shorter than the length of the vibrating arm 10.

Referring to FIG. 9B, the length of the extended groove 14a is denoted H5. Due to crystal etching anisotropy, etching marks remain at both ends of each groove 14a in the Y-axis direction (FIG. 9C). The etching mark on the distal end of the groove 14a has a length denoted H7, and the etching mark on the proximal end (nearest the base 30) of the groove 14a has a length denoted H8. Hence, the actual length of the extended groove 14a contributing to arm oscillation is its length less the lengths H7, H8 of these etching marks. This is shown in FIG. 9B, in which the length of the groove 14a actually contributing to arm oscillation is denoted H6. The length H6 can be equal to the length of the vibrating arm 10. With such a configuration, even if miniaturized, areas in which electrodes can be formed on the arms are secured and CI values can be lowered.

As a result of the extended grooves 14a extending half-way onto the hammer-head portions, areas in which electrodes can be formed, the efficiency of electric-field increase, and CI values can be reduced. Also, good frequency control can be achieved in the same manner as conventionally done on the surface of the groove 13 on which the extended grooves 14a are not formed. Note that the rigidity of this embodiment 130 is reduced due to the presence of the extended groove 14a, but the rib features 50 formed in the grooves 13 and 14a add back more rigidity than achieved using conventional configurations.

By way of example, the width of the tuning-fork type piezoelectric vibrating piece 130 is 55 μm. Each vibrating arm has a length of 1.25 mm. Each groove 13, 14a has a width of 30 μm. Each extended groove 14a has a length of 0.95 mm. The distal end of each extended groove 14a is 0.1 mm from the hammer-head portion 12. This configuration achieves an approximately 8% reduction in CI value compared to conventional configurations.

Representative Embodiment of Piezoelectric Frame

Figure 10:
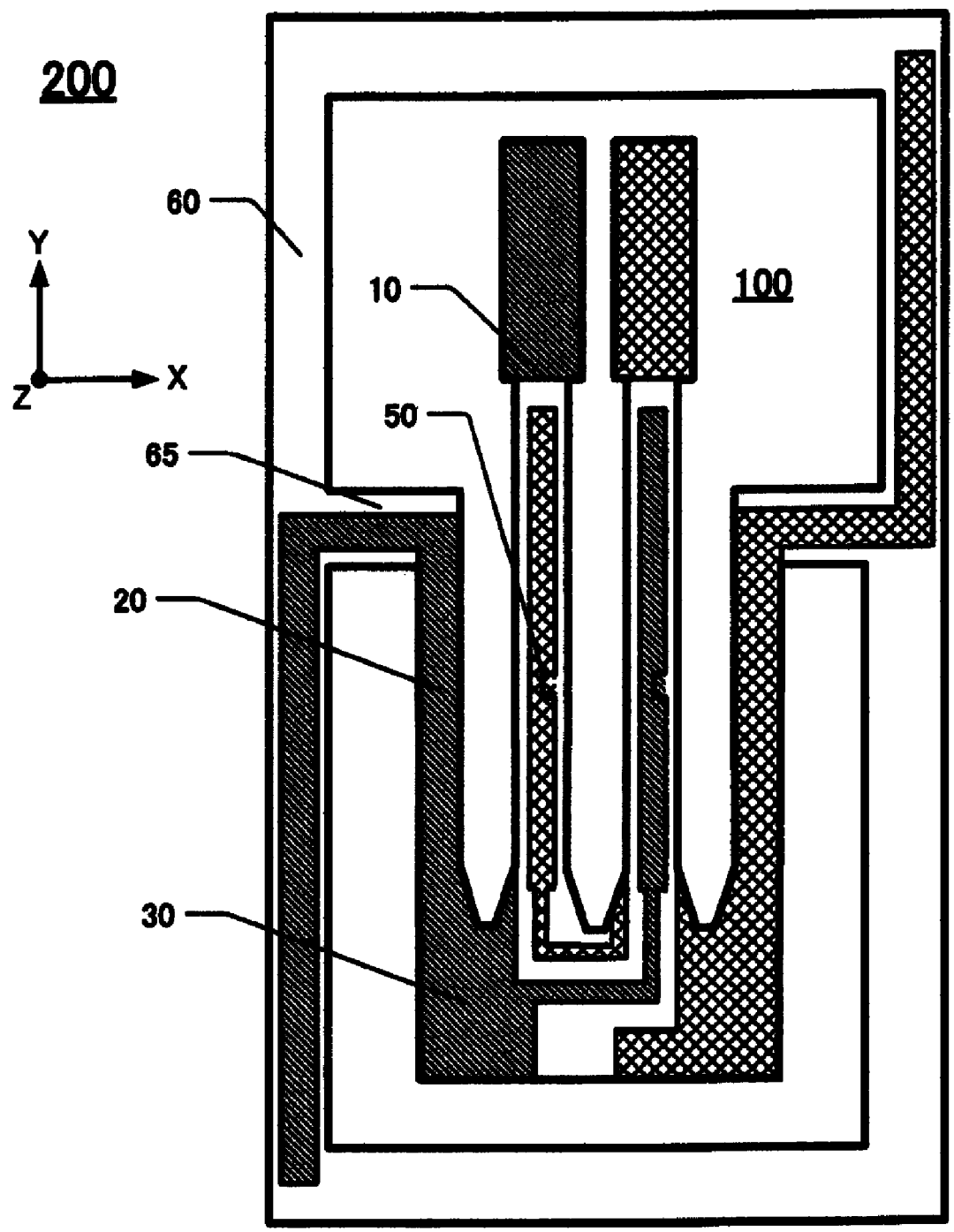
FIG. 10 is a plan view of an exemplary configuration of a piezoelectric frame.

A plan view of an embodiment of a piezoelectric frame 200 is shown in FIG. 10. This embodiment of a piezoelectric frame 200 comprises the first embodiment 100 of a tuning-fork type piezoelectric vibrating piece and an outer frame 60 surrounding the piece 100. The piece 100 comprises vibrating arms 10, supporting arms 20, and a base 30. The upper surfaces (shown) of the vibrating arms have respective grooves 13, and the under-surfaces have respective grooves 14. Each groove 13, 14 includes a respective rib feature 50, and electrodes are selectively formed over the grooves 13, 14, the supporting arms 20, and the base 30. The grooves 13, 14 and rib features 50 have already been described above, so further description thereof is not necessary.

The outer frame 60 is connected to the supporting arms 20 via connecting arms 65 that extend in the −X and +X directions, respectively. This configuration of a piezoelectric frame exhibits excellent CI value, pulling sensitivity S, and rigidity. In this embodiment, the first embodiment of a tuning-fork type piezoelectric vibrating piece 100 is used as an exemplary configuration. However, it will be understood that any of the various other embodiment of piezoelectric vibrating piece can be used, such as but not limited to the embodiments 110, 120, 130, 140 described above.

First Representative Embodiment of Piezoelectric Device

Figure 11:
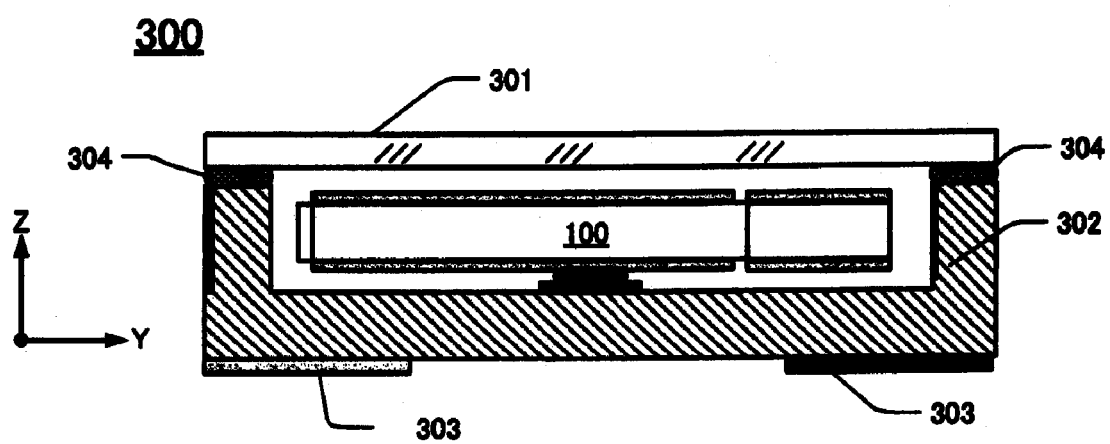
FIG. 11 is a cross-sectional view of an exemplary configuration of a piezoelectric device.

FIG. 11 is a cross-sectional view of an embodiment of a piezoelectric device 300. The piezoelectric device 300 comprises, by way of example, the first embodiment 100 of a tuning-fork type piezoelectric vibrating piece. The vibrating piece 100 is mounted on a package base 302 providing an interior void sized to accommodate the vibrating piece. The void is covered with a lid 310 that is sealed to the upper rim of the package base 302 using a sealing material 304. Sealing is performed in a vacuum chamber at a desired vacuum to produce the desired vacuum state inside the package. The lid 301 can be made of borosilicate glass, for example.

The package base 302 desirably is made of a ceramic material, and is formed by stacking rectangular layers of ceramic, followed by sintering. External electrodes are formed on the under-surface of the package base 302 so that the package can be a Surface Mount Device.

To fabricate the device 300 shown in FIG. 11, the first embodiment of a tuning-fork type piezoelectric vibrating piece 100 is connected to the package base 302 of the piezoelectric device 300 by the supporting arms 20. For example, the supporting arms 20 are mounted onto respective connecting electrodes provided on the package base 302. To mount the supporting arms 20, an electrically conductive adhesive is applied to the connecting electrodes and partially cured to allow placement of the distal termini of the supporting arms on the adhesive. Next, the adhesive is fully curing in a curing furnace. Thus, the supporting arms 20 and connecting electrodes of the package base 302 are connected together and to respective external electrodes 303 outside the package.

Next, frequency adjustment of the piezoelectric vibrating device 300 is performed. Desirably, frequency adjustment is performed by irradiating a laser beam on selected locations on the hammer-head portions 12 of the vibrating arms to evaporate a the metal film in the selected locations. This laser-evaporation reduces the amount of remaining metal, which correspondingly changes the vibration frequency. Then, after performing operational inspection and testing of the device, the piezoelectric vibrating device 300 is completed.

Thus, a piezoelectric vibrating device having excellent CI value, pulling sensitivity S, and rigidity can be manufactured. Although this embodiment was described in the context of it comprising the first embodiment 100 of a tuning-fork type piezoelectric vibrating piece 100, it will be understood that any of various other embodiments such as 110, 120, 130, or 140 alternatively can be used.

Second Representative Embodiment of Piezoelectric Vibrating Device

A second embodiment of a piezoelectric device comprises a piezoelectric frame 200, a lid covering the upper surface of the piezoelectric frame 200, and a package base supporting the under-surface of the piezoelectric frame 200. The lid, piezoelectric frame 200, and package base are bonded together by siloxane bonding, as in conventional piezoelectric devices. Such devices including the piezoelectric frame 200 exhibit excellent CI value, pulling sensitivity S, and rigidity.

The invention has been described above in the context of preferred embodiments. It will be understood by those of ordinary skill in the art that the invention can be varied and/or modified within the scope of this disclosure. For example, the fourth embodiment of a tuning-fork type piezoelectric vibrating piece comprises the rib features 50. Alternatively, the piece can comprise either the rib features 51 or rib features 52.

What is claimed is:

1. A piezoelectric vibrating piece, comprising;
a base;
a pair of vibrating arms extending in a Y-axis direction from one end of the base, each vibrating arm having a first surface and an opposing second surface;
a respective groove defined by each of the first and second surfaces of each vibrating arm, each groove extending in the Y-axis direction and having a first width; and
at least one rib feature situated in each groove, each rib feature extending in an X-axis direction, normal to the Y-axis direction, from at least one groove wall to define a respective opening in the groove having a second width that is narrower than the first width of the groove.

2. The piezoelectric vibrating piece according to claim 1, further comprising respective excitation electrodes on and in each groove and respective rib feature, the excitation electrodes serving to excite the vibrating arms.

3. The piezoelectric vibrating piece according to claim 2, wherein:
each groove has a mid-length in the Y-axis direction; and
the respective rib feature in the groove is situated in a distance range from mid-length or less, in the Y-axis direction toward the base.

4. The piezoelectric vibrating piece of claim 1, wherein in each groove the respective rib feature extends from one longitudinal wall of the groove.

5. The piezoelectric vibrating piece according to claim 4, wherein:
each groove has a mid-length in the Y-axis direction; and
the respective rib feature in the groove is situated in a distance range from mid-length or less, in the Y-axis direction toward the base.

6. The piezoelectric vibrating piece of claim 4, wherein:
each groove has a +X wall and an opposing −X wall;
the +X wall and −X wall are longitudinal walls of the groove that extend in the Y-axis direction; and
the rib feature extends from the +X wall toward the −X wall.

7. The piezoelectric vibrating piece according to claim 6, wherein:
each groove has a mid-length in the Y-axis direction; and
the respective rib feature in the groove is situated in a distance range from mid-length or less, in the Y-axis direction toward the base.

8. The piezoelectric vibrating piece of claim 1, wherein:
each groove is defined by two longitudinal walls; and
in each groove the respective rib feature comprises respective portions that extend from both longitudinal walls of the groove portion.

9. The piezoelectric vibrating piece according to claim 8, wherein:
each groove has a mid-length in the Y-axis direction; and
the respective rib feature in the groove is situated in a distance range from mid-length or less, in the Y-axis direction toward the base.

10. The piezoelectric vibrating piece according to claim 1, wherein:
each groove has a mid-length in the Y-axis direction; and
the respective rib feature in the groove is situated in a distance range from mid-length or less, in the Y-axis direction toward the base.

11. The piezoelectric vibrating piece according to claim 10, wherein:
each groove has a mid-length in the Y-axis direction; and
the respective rib feature in the groove is situated in a distance range from mid-length or less, in the Y-axis direction toward the base.

12. The piezoelectric vibrating piece according to claim 1, wherein each rib feature has a width in a range from no less than 40% to no more than 95% of the first width.

13. The piezoelectric vibrating piece according to claim 1, wherein:
each groove and rib feature has a respective thickness in a direction normal to the Y-axis direction and X-axis direction; and
the thickness of the rib feature is in a range from no less than 70% to no more than 95% of the thickness of the groove.

14. The piezoelectric vibrating piece according to claim 1, wherein:
each vibrating arm has a width in the X-axis direction;
each vibrating arm comprises a respective hammer-head portion situated on a distal end of the vibrating arm, each hammer-head portion being wider than the width of the respective vibrating arm; and
the respective groove on the first surface of each vibrating arm extends to the respective hammer-head portion.

15. A piezoelectric device, comprising:
a piezoelectric vibrating piece as recited in claim 1;
a lid covering the piezoelectric vibrating piece; and
a package base supporting the piezoelectric vibrating piece.

16. A piezoelectric frame, comprising:
a base;
a pair of vibrating arms extending in a Y-axis direction from one end of the base, each vibrating arm having a first surface and an opposing second surface;
a respective groove defined by each of the first and second surfaces of each vibrating arm, each groove extending in the Y-axis direction and having a first width;
a respective excitation electrode extending from the base into each groove;
a pair of supporting arms connected to the base and extending outboard of respective vibrating arms in the Y-axis direction;
a respective connecting arm extending from each supporting arm in an X-axis direction normal to the Y-axis direction;
a frame portion surrounding the base, vibrating arms, and supporting arms, the base being connected to the connecting arms; and
at least one rib feature situated in each groove, each rib feature extending in the X-axis direction from at least one longitudinal wall of the groove to define a respective opening in the groove having a second width narrower than the first width of the groove.

17. The piezoelectric frame of claim 16, further comprising a respective excitation electrode in each groove and extending over the respective rib feature in the groove.

18. The piezoelectric frame of claim 16, wherein in each groove the respective rib feature extends from one longitudinal wall of the groove.

19. The piezoelectric frame of claim 18, wherein:
each groove has a +X wall and an opposing −X wall;
the +X wall and −X wall are longitudinal walls of the groove that extend in the Y-axis direction; and
the rib feature extends from the +X wall toward −X wall.

20. The piezoelectric vibrating piece of claim 16, wherein:
each groove is defined by two longitudinal walls; and
in each groove the respective rib feature extends from both longitudinal walls of the groove portion.

21. A piezoelectric device, comprising:
a piezoelectric frame as recited in claim 16;
a lid covering the piezoelectric frame; and
a package base supporting the piezoelectric frame.

* * * * *